United States Patent [19]

English

[11] 4,340,875
[45] Jul. 20, 1982

[54] TRANSVERSAL FILTER

[75] Inventor: Kevin S. English, Ferntree Gully, Australia

[73] Assignee: Australian Telecommunications Commission, Melbourne, Australia

[21] Appl. No.: 109,589

[22] Filed: Jan. 4, 1980

[30] Foreign Application Priority Data

Jan. 4, 1979 [AU] Australia .............................. PD7273

[51] Int. Cl.³ ..................... H03H 17/02; H03H 15/00
[52] U.S. Cl. .................................. 333/166; 333/28 R; 333/165; 364/819
[58] Field of Search ..................... 333/165, 166, 28 R; 364/819–821, 824, 728

[56] References Cited

U.S. PATENT DOCUMENTS

| 3,268,836 | 8/1966 | Linke | 333/28 R X |
| 3,935,439 | 1/1976 | Buss et al. | 364/824 |
| 3,980,873 | 9/1976 | Mattei | 364/724 X |

*Primary Examiner*—Marvin L. Nussbaum
*Attorney, Agent, or Firm*—Sughrue, Mion, Zinn, Macpeak and Seas

[57] ABSTRACT

A transversal filter having an overall impulse response of the form $$h(\tau) = f(\tau) * \sum_{i=0}^{N-1} h_i \cdot \delta(\tau - \tau_i)$$

and producing, from an applied input x(t) an output $$y(t) = \int_0^\infty h(\tau) \cdot x(t - \tau) \, d\tau$$

where y(t) is obtained by lowpass filtering of a waveform z(t) in use generated in the filter, where z(t) takes the form:

$$z(t) = x_{k-i} h_i; \ (k - i)T + \tau_i \leq t < (k - i + 1)T + \tau_{i-1}$$

$$x_k = x(kT)$$

where
  $h_i$ represents a set of stored coefficients,
  $f(\tau)$ is an impulse response accounting for fixed linear filtering at the input and output, independent of the settings $h_i$, and
  $\delta(\tau-\tau_i)$ is the Dirac delta function defined as a function of time interval $\tau$ and of a set of time delays $\tau_i$, where $\tau_i$ is not equal to iT.

11 Claims, 11 Drawing Figures

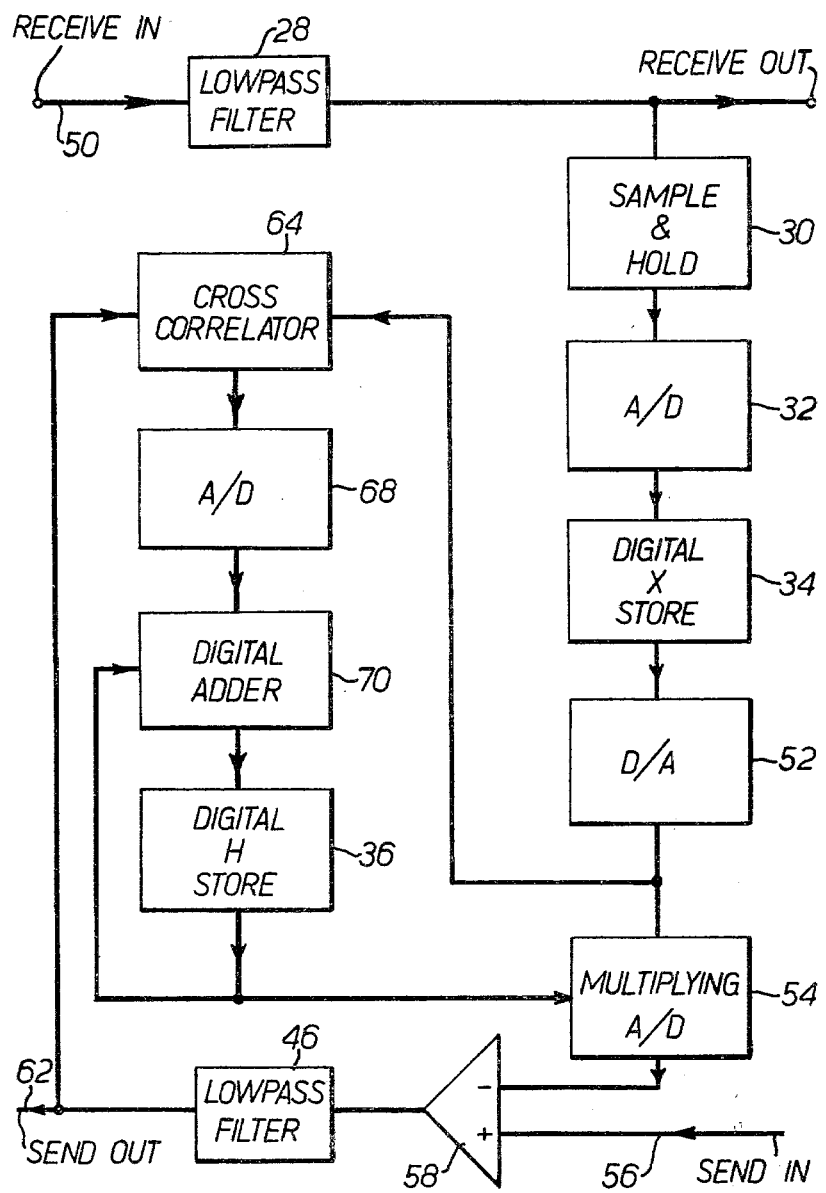

TRANSVERSAL FILTER

BACKGROUND OF THE INVENTION (i) Field of the Invention

This invention relates to a transversal filter and to an echo canceller employing such a filter.

Transversal filters employing tapped delay lines to generate delayed versions of a signal applied to the filter are well known. The delayed signal versions are multiplied by predetermined multiplication coefficients and accumulated to produce a filtered output signal having characteristics determined by the predetermined coefficients. Such arrangements have particular application in echo cancellers for communications links where echo signals present in a four wire communications link can be cancelled by connecting the filter across input and output connections of the four wire link to hybrids providing junctions between the four wire link and respective two wire links. Means is provided for adjusting the multiplying coefficients as necessary to effect echo cancelling. Cancellers of this kind have the advantage that they can be arranged to provide for time-variation of the multiplication coefficients so that the characteristics of the filter can be adjusted to effect echo cancellation even where the characteristics of the four wire link are changing at appreciable rates.

(ii) Prior Art

Transversal filters and echo cancellers of the above kind have been the subject of considerable development work and have been described in numerous prior publications. Particularly, Australian Patent specification No. 435,932 (Western Electric Company) describes the basic form of the transversal structure for an adaptive echo canceller. The article "Echo Cancellation on Time Variant Circuits" by N. Demytko and K. S. English published in the proceedings of the IEEE, Vol. 65, No. 3, March 1977 at pages 444–453 contains a general description of such cancellers and the incorporated transversal filters.

One form of transversal filter can be constructed where the delay line comprises electric signal delay elements which provide an output signal varying continuously in time. As is well known, the impulse response of such a delay element is represented by the expression:

$$\delta(\tau\text{-}T)$$

where $\delta(\tau)$ is the Dirac delta function,

T is the transmission delay introduced by the element.

By cascading N such delay elements and summing the outputs from each delay element with weighting coefficients $h_i$, an impulse response can be realised which is represented by the expression:

$$h(\tau) = \sum_{i=0}^{N-1} h_i \cdot \delta(\tau - T \cdot i)$$

Such a filter is described in the aforementioned Australian patent specification No. 435,932.

Another form of transversal filter employs a sampling technique in which samples of the input signal are taken at equi-spaced time intervals T, and stored in digital form. If the input signal is known to contain no frequency components above 1/2T, it then follows from the Shannon sampling theorem that the unsampled input signal can be reconstructed at all times instants from the stored samples. After each acquisition of a new input sample, the stored samples are multiplied by the respective stored coefficients to produce a series of product signals. These are summed then converted from digital to analogue representations and filtered with a lowpass filter of cut-off frequency 1/2T to produce the output signal. This technique is useful since the sample store can comprise a shift register which, after updating by acquisition of each new sample, is rapidly circulated together with the store for multiplier coefficients to effect time-sharing of a single high-speed multiplier over all multiplications operations. This circulation technique is described in greater detail in the book "Theory and Applications of Digital Signal Processing", by L. R. Rabiner and B. Gold, Prentice-Hill, 1975, pages 542–551.

Several alternate forms of such a filter are obtained by interchanging the order of digital to analogue conversion and the multiplication and summation operations.

All such realisations of transversal filters are characterised by an overall impulse response defined by the convolution relationship:

$$h(\tau) = f(\tau) * \sum_{i=0}^{N-1} h_i \delta(\tau - i \cdot T)$$

In the above:

$h_i$ represent the multiplier coefficients,

N is the number of stored coefficients,

T is the time spacing of samples of the input signal $\tau$ is the time interval and $f(\tau)$ is the impulse response of a filter accounting for extraneous linear filtering, independent of the coefficients $h_i$. The convolution operator "*" is defined such that a relationship of the form $h(\tau)*g(\tau)$ represents the integral relationship $$h(\tau) = \int_{-\infty}^{\infty} f(t) \cdot g(\tau - t) dt$$

The present invention is based on the realisation that the impulse response of the overall filter can, with advantage, be modified from the above to provide a physical structure which can be simpler in form.

SUMMARY OF THE INVENTION

According to the present invention, there is provided a transversal filter, operating in use on samples of an input signal sampled at time intervals T apart, having an overall impulse response defined by the convolution expression:

$$h(\tau) = f(\tau) * \sum_{i=0}^{N-1} h_i \cdot \delta(\tau - \tau_i)$$

where $h_i$ represents a set of stored coefficients,

N is the number of stored coefficients, $f(\tau)$ is an impulse response accounting for fixed linear filtering at the input and output, independent of the settings $h_i$, and $\delta(\tau\text{-}\tau_i)$ is the Dirac delta function defined as a function of time interval $\tau$ and of a set of time delays $\tau_i$, where $\tau_i$ is not equal to $iT$. Preferably, the set of time delays $\tau_i$ are defined as follows:

$$\tau_i = iT\left(1 - \frac{1}{N}\right)$$

The invention also provides a filter having an overall impulse response of the form $$h(\tau) = f(\tau)^* \sum_{i=0}^{N-1} h_i \cdot \delta(\tau - \tau_i)$$

and producing, from an applied input $x(t)$ an output $$y(t) = \int_0^\infty h(\tau) \cdot x(t - \tau) \, d\tau$$

where $y(t)$ is obtained by lowpass filtering of a waveform $x(t)$ in use generated in the filter, where $z(t)$ takes the form:

$$z(t) = x_{k-i} h_i; \quad (k - i) T + \tau_i \leq t < (k - i + 1)T + \tau_{i-1}$$

$$x_k = x(kT)$$

$f(\tau)$, $h_i$ and $\delta(\tau - \tau_i)$ being as above defined.

The invention also provides a transversal filter for generating, from an input signal $x(t)$, a filtered output signal $y(t)$; the filter comprising
  (a) sampling means for sampling the input signal at consecutive equi time-spaced intervals $T$ to produce the sequence of consecutive samples $x_n (n = \ldots, 0, 1, 2, 3, \ldots)$;
  (b) first storing means for storing consecutive sets of said samples, each such set, $S_i (i = -\infty, \ldots 0, \ldots \infty)$ comprising the N samples $x_{i-k} (k = 0, 1, \ldots N-1)$;
  (c) second storing means for storing N coefficients $h_k (k = 0, 1, \ldots, N-1)$ together representing a linear filter impulse response;
  (d) generating means for generating from each said set of stored samples, and from the impulse response coefficients stored in said second storing means, the products $h_k \cdot x_{i-k'}$ and for presenting these as product signals at an output from the generating means; and
  (e) a lowpass filter connected to receive the said product signals and to generate the said output signal by lowpass filtering the product signals whereby the said input and output signals are related substantially by the following convolution relationship:

$$Y(t) = \phi_{\frac{T}{N}}(t)^* \sum_{i=0}^{N-1} h_i x(t - i \cdot T')$$

where $\phi_{\frac{T}{N}}(t) = 1, \; 0 < t < \frac{T}{N}$

= 0, otherwise;

and $T'$ is a time interval not equal to $T$.

Normally, said generating means presents said product signals at its output consecutively as analogue signals of equal duration at equi-spaced intervals $T/N$. Preferably, the said consecutive analogue signals from the generating means are of duration $T/N$. $T'$ is preferably slightly greater or slightly less than $T$. Generally, the latter is preferable because it permits circuit designs using simple shift registers.

Said first storing means may comprise a digital shift register, an analogue-to-digital converter then being connected between the said sampling means and said shift register. Said second storing means may comprise a second digital shift register with the impulse response coefficients being, in use, stored in sequence therein in digital form. The said generating means may, for example, comprise a digital multiplier together with means for circulating the said shift registers so as to apply corresponding outputs $x_k$, $h_k$ from the registers thereto for multiplication after each new sample has been admitted to the first shift register. Alternatively, the output from one or both of said shift registers may be converted to analogue form for multiplication in a multiplier adapted to multiply either two analogue signals or a digital and an analogue signal. If produced in analogue form, the product signals may be directly applied, as generated, to the lowpass filter. If generated in digital form, the product signals are first converted to analogue form before application to the lowpass filter.

The invention also provides an echo canceller comprising in combination, a transversal filter as described above, combining means, and coefficient updating means, said combining means being connected in use to receive said output signal and a further signal and to combine these to produce a combined signal; said updating means being connected to receive said combined signal and to in use modify said coefficients $h_k$ so that said output signal tends to suppress in said combined signal components which correspond to said input signal. The updating means may comprise means for generating a signal representative of the cross correlation between the said combined and input signals and means for modifying the coefficients in accordance with computed values of such cross correlation.

DESCRIPTION OF THE DRAWINGS

The invention is further described with reference to the accompanying drawings in which:

FIG. 6 is a circuit diagram of an echo canceller constructed in accordance with the invention.

DETAILED DESCRIPTION

Figure 1:
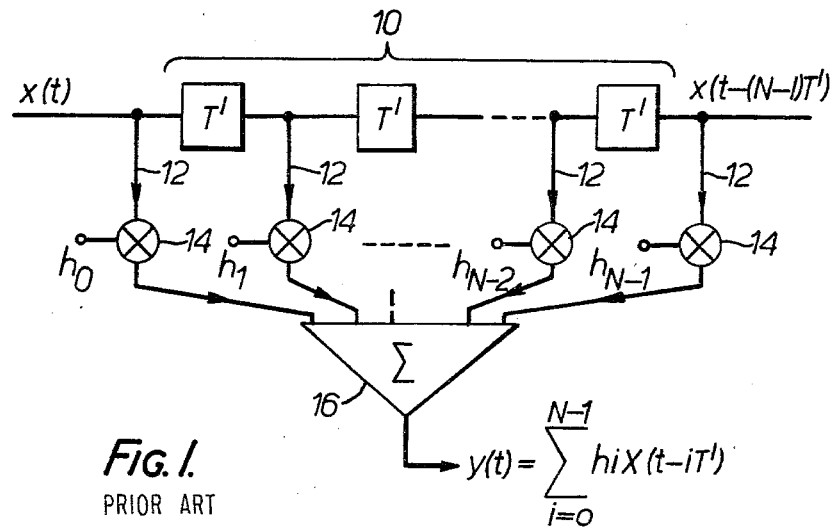
FIG. 1 is a circuit diagram of a known form of transversal filter for continuous signals.

Referring firstly to FIG. 1, there is shown therein a transversal filter of known type having a delay line 10 with a plurality of tapped outputs 12 at spacings $T'$ and arranged to receive an input signal $x(t)$ such as to produce at each of the tapped outputs delayed versions of this signal $x(t)$. These delayed versions are applied to individual multipliers 14 for multiplication by respective coefficients $h_0 \ldots, h_{N-1}$. The so multiplied outputs are applied to a summation circuit 16 to produce an output $y(t)$. The filter shown is of a general type in which the impulse response coefficients are applied to make up the overall impulse response in the form:

$$h(\tau) = \sum_{i=0}^{N-1} h_i \delta(\tau - iT)$$

Correspondingly, the output signal y(t) is related to the input signal by the equation:

$$y(t) = \sum_{i=0}^{N-1} h_i x(t - iT)$$

Figure 2:
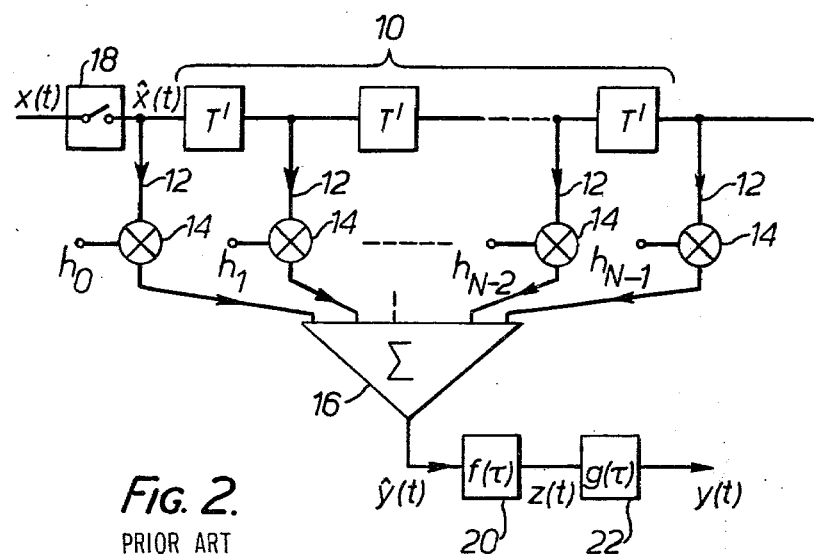
FIG. 2 is a diagram showing modifications to the filter of FIG. 1 to accommodate sampling techniques.

The filter shown in FIG. 1 is often implemented using digital techniques by operating only on equispaced samples from the input signal. One form of such a filter is shown in FIG. 2 where a sampler 18 and linear analogue filters 20 and 22 have been added to the structure of FIG. 1. Sampler 18 samples the input signal x(t) at intervals T to produce sampled signals $x_k$ (where $x_k = x(kT)$). The action of the sampler 18 can be modelled mathematically by multiplying input x(t) with a train of unit-area impulses p(t) to produce a train of impulses $\hat{x}(t)$ whose area is proportional to x(t):

$$\hat{x}(t) = p(t) \cdot x(t) \text{ where } p(t) = \sum_{n=-\infty}^{\infty} \delta(t - nT)$$

$$= \sum_{n=-\infty}^{\infty} x(kT) \cdot \delta(t - nT)$$

Filter 22 is an ideal lowpass filter with cutoff frequency 1/2T whose impulse response is represented by $g(\tau)$. As a consequence of the sampling theorem, if x(t) contains no frequency components above 1/2T, then x(t) can be exactly recovered from $\hat{x}(t)$ by filtering $\hat{x}(t)$ through filter 22, as described by the relationship:

$$x(t - \tau) = g(t)^* \hat{x}(t - \tau) \text{ for all delays } \tau$$

Filter 20 lumps the non-idealities of a practical realisation of the filter into a single impulse response $f(\tau)$. The overall response of the filter shown in FIG. 2 is described by the convolution relationship:

$$y(t) = f(t)^* g(t)^* \sum_i h_i \cdot \hat{x}(t - i \cdot T)$$

Identifying $g(t)^*\hat{x}(t-i.T')$ as $x(t-i.T')$ obtains the equivalent relationship:

$$y(t) = f(t)^* \sum_i h_i \cdot x(t - i \cdot T)$$

Correspondingly, the overall impulse response of the filter is of the form:

$$h(\tau) = f(\tau)^* \sum_i h_i \cdot \delta(t - i \cdot T)$$

provided that x(t) contains no frequency components above 1/2T. This impulse response is identical to that obtained for FIG. 1 except for the presence of the fixed response $f(\tau)$. Known sampled data transversal filters are of the form shown in FIG. 2 but with the special choice of T=T'. In other words, the unit delays through the transversal filter are exactly equal to the sampling interval.

Figure 3:
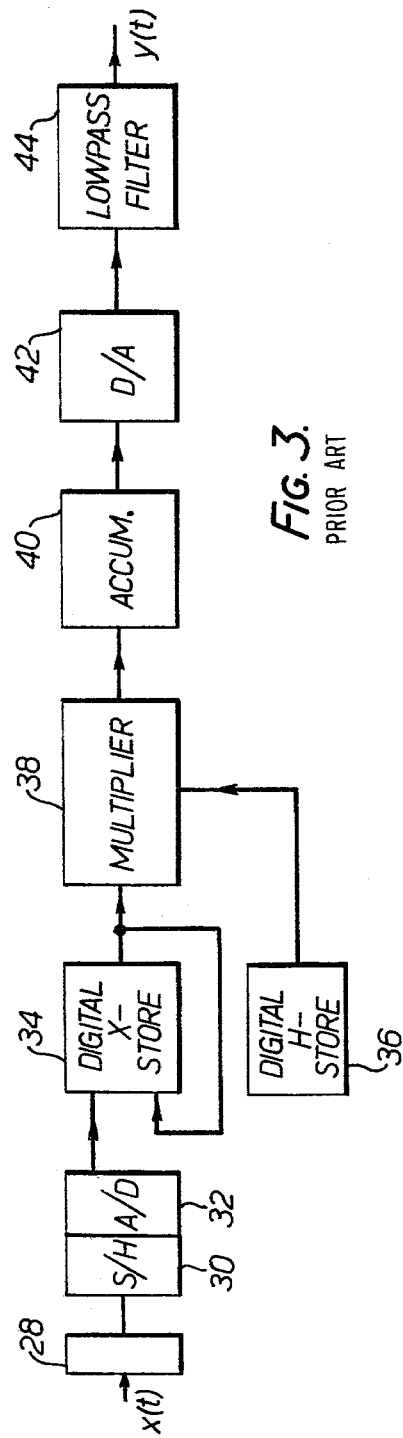
FIG. 3 is a diagram showing a known form of transversal filter employing digital techniques.

A common method of implementing the above is shown in FIG. 3. Here a lowpass filter 28 with cutoff frequency 1/2T preconditions input signal x(t) to avoid aliasing problems. A sample and hold circuit 30 connects filter 28 to an analogue to digital convertor 32 connected to sequentially supply the samples, in digitally encoded form, to a digital store 34. The coefficients $h_i$ are stored in a second digital store 36. Outputs from store 34 and store 36 are passed to digital multiplier 38 and the output from multiplier 38 is applied to digital accumulator 40. The contents of the two stores 34 and 36 are circulated every time a new sample replaces the oldest sample in store 34, such that the series of products $x_{k-i}\cdot h_i (i=0, \ldots, N-1)$ are produced at the output of multiplier 38. The products are summed by the accumulator 40 so that at the instant of acquiring the sample $x_{k+1}$, the accumulator 40 holds the digital representation of $y_k$ given by:

$$y_k = \sum_{i=0}^{N-1} h_i \cdot x_{k-i}$$

Convertor 42 converts the digital output from accumulator 40 to analogue form at the instant of acquiring a new input sample, then holds the convertor 42 output at a constant level until the next input sample acquisition.

The overall response of the structure in FIG. 3 is represented by the impulse response:

$$h(\tau) = f(\tau)^* \sum_{i=0}^{N-1} h_i \delta(\tau - i \cdot T)$$

where $h_i$, T, N and $f(\tau)$ are as hereinbefore defined. Impulse response $f(\tau)$ will be the convolution of the following components:

(i) Passband ripple in the pre-conditioning lowpass filter 28.
(ii) Passband ripple in the post-conditioning lowpass filter 44.
(iii) Flat delay of duration T to account for the processing delay between acquiring sample $x_k$ and outputting result $y_k$.
(iv) Zero-order hold response modelling the effect of holding the output from converter 42 at a constant level $y_k$ over the period $(k+1).T$ to $(k+2).T$. This is represented by an impulse response $\phi_T(\tau)$ of the form:

$$\phi_T(\tau) = \begin{cases} 1, & 0 \leq \tau < T \\ 0, & \text{otherwise} \end{cases}$$

The invention utilizes the advantages to be gained by selecting the unit delays T' in FIG. 2 to be slightly different from the sampling interval T. Preferably, T' is selected in accordance with the relationship:

$$T' = T \cdot \left(1 - \frac{1}{N}\right)$$

Figure 5A:
FIGS. 5(a) to 5(f) show representative waveforms used to illustrate the nature of the invention.
Figure 5B:
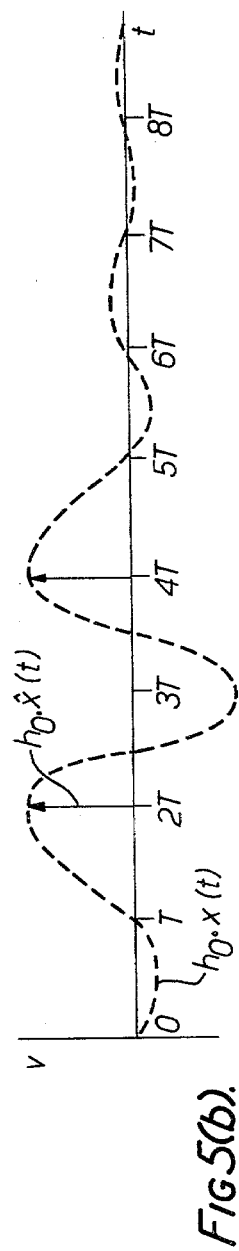
Figure 5C:
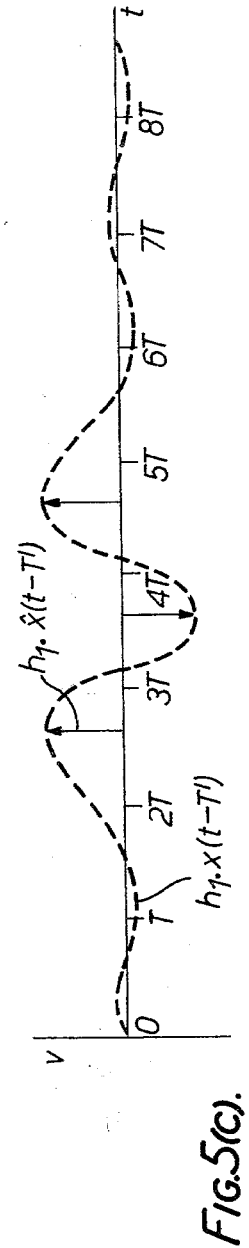
Figure 5D:
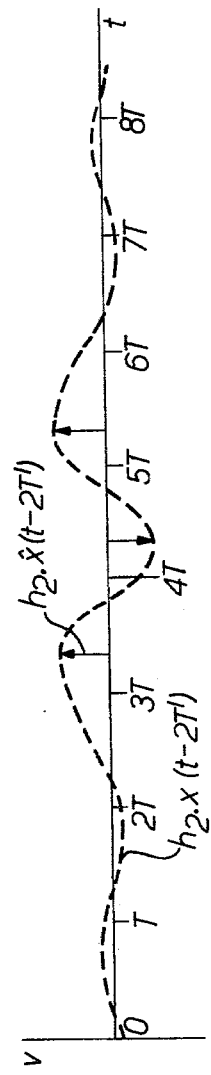

FIGS. 5(a) to 5(f) illustrate representative waveforms from a transversal filter comprising three coefficients and built in accordance with the present invention. FIG. 5(a) illustrates a typical impulse response of a transversal filter with three coefficients $h_o$, $h_1$ and $h_2$ and unit delays of T'. FIG. 5(b) illustrates a continuous waveform x(t) (shown by dashed line) band-limited to 1/2T; and also x̂(t), the impulse representation of the result of sampling x(t) at unit intervals T, both waveforms scaled by coefficient $h_o$. FIG. 5(c) shows a replica of both x(t) and x̂(t) delayed by T' and scaled by the factor $h_1$. FIG. 5(d) shows x(t) and x̂(t) delayed by a further T' and scaled by $h_2$. In each of the FIGS. 5(b), 5(c) and 5(d) the continuous waveforms $h_i.x(t-i.T')$ can be reconstructed from the sampled versions $h_i.\hat{x}(y-i.T')$ by lowpass filtering with cutoff frequency 1/2T.

Figure 5E:
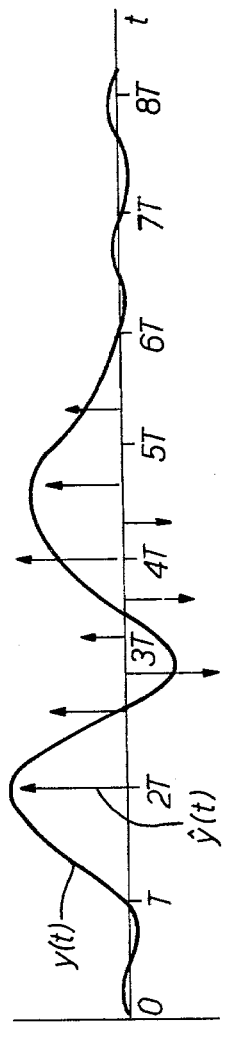

Superimposing both the unsampled and sampled waveforms of FIGS. 5(b), 5(c) and 5(d) obtains the waveforms y(t) and ŷ(t) of FIG. 5(e):

$$y(t) = \sum_{i=0}^{2} h_i \cdot x(t - i \cdot T')$$

$$y(t) = \sum_{i=0}^{2} h_i \cdot x(t - i \cdot T')$$

Waveform y(t) is also the result of lowpass filtering ŷ(t).

Figure 5F:
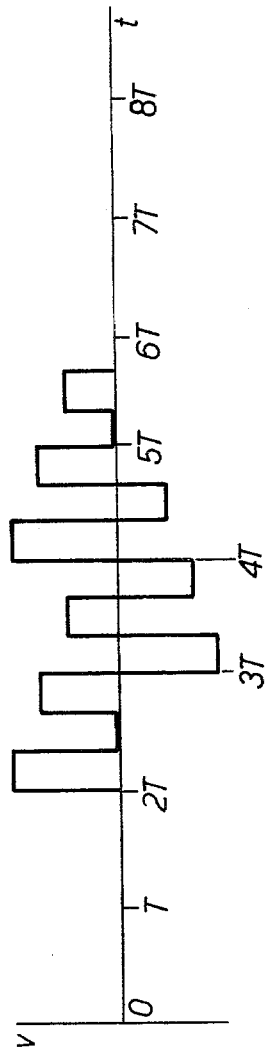

FIG. 5(f) illustrates a physically realisable form of waveform ŷ(t) denoted by Z(t) and represented mathematically by the convolution of ŷ(t) and an impulse response of the form:

$$\phi_{\frac{T}{3}}(\tau) = \begin{cases} 1, & 0 \leq \tau < \frac{T}{3} \\ 0, & \text{otherwise} \end{cases}$$

Filtering Z(t) with a lowpass filter of cutoff frequency (1/2T) hz obtains the waveform $\phi_{T/3}(\tau)*y(t)$ which is a good approximation to y(t). The temporal separation of the component impulses in ŷ(t) (FIG. 5(e)) enables Z(t) to be generated by presenting each product $h_i.x_{k-i}$ at the output for a duration of T/3. This avoids the explicit summation of lagged products required if the sampling interval is equal to the unit delays. For general values of N and T'=T.(1−1/N) the same separation of lagged products is achieved.

The value T'=T.(1−1/N) is only a preferred value and values for T'≠T other than T'=T.(1−1/N) can be used to achieve the separation effect.

With reference to FIG. 2, the impulse representation of the sampled output y(t) is given by the expression:

$$\hat{y}(t) = \sum_{i=0}^{N-1} h_i \cdot \hat{x}\left(t - i \cdot T \cdot \left(1 - \frac{1}{N}\right)\right)$$

Again a physically realisable version z(t) of y(t) is obtained by considering the result of convolving y(t) with an impulse response of the form:

$$\phi_{\frac{T}{N}}(\tau) = \begin{cases} 1, & 0 \leq \tau < \frac{T}{N} \\ 0, & \text{otherwise} \end{cases}$$

Now $z(t) = \phi_{\frac{T}{N}}(\tau) * \hat{y}(t)$ $$= \sum_{i=0}^{N-1} h_i \cdot \phi_{\frac{T}{N}}(\tau) * \hat{x}\left(t - i \cdot T\left(1 - \frac{1}{N}\right)\right)$$

-continued $$= \sum_{i=0}^{N-1} h_i \cdot \phi_{\frac{T}{N}}(\tau) \sum_{k=-\infty}^{\infty} x_k \cdot$$

$$\delta\left(t - i \cdot T\left(1 - \frac{1}{N}\right) - k \cdot T\right)$$

$$= \sum_{i=0}^{N-1} h_i \cdot \phi_{\frac{T}{N}}(\tau) \sum_{k=-\infty}^{\infty} x_{k-i} \cdot \delta\left(t - k \cdot T + \frac{i \cdot T}{N}\right)$$

$$= \sum_{i=0}^{N-1} \sum_{k=-\infty}^{\infty} h_i \cdot x_{k-i} \cdot \phi_{\frac{T}{N}}\left(t - k \cdot T + \frac{i \cdot T}{N}\right)$$

In this form waveform z(t) is seen to comprise piecewise constant segments of duration T/N as given by:

$$z(t) = h_i \cdot x_{k-i}, k \cdot T - \frac{i \cdot T}{N} \leq t < k \cdot T - \frac{i \cdot T}{N} + \frac{T}{N}$$

$$, k = -\infty, \ldots \infty$$

$$i = 0, \ldots N - 1$$

Figure 4:
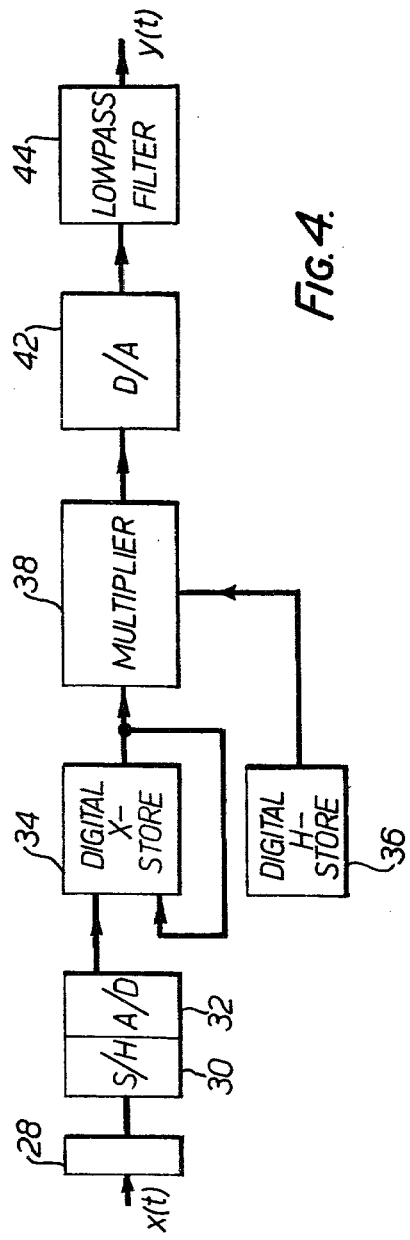
FIG. 4 is a diagram like FIG. 3 but showing apparatus constructed in accordance with the invention.

FIG. 4 shows a transversal filter constructed in accordance with the invention. In it, like components to those described in relation to FIG. 3 are designated by like numerals. It will be seen that the circuitry is essentially the same as that shown at FIG. 3 except that accumulator 40 is omitted, the output from the multiplier 38 being passed directly to the converter 42. Digital stores 34 and 36 are circulated once after each acquisition of a new input sample $x_k$, to generate the aforementioned waveform z(t) at the output of converter 42.

The overall response of the structure in FIG. 4 is represented by the impulse response:

$$h(\tau) = f(\tau) * \sum_{i=0}^{N-1} h_i \cdot \delta\left(\tau - i \cdot T\left(1 - \frac{1}{N}\right)\right)$$

where N, T and f(τ) are as hereinbefore defined.

Impulse response f(τ) will be the convolution of the following components:
  (i) Passband ripple in the pre-conditioning lowpass filter 28.
  (ii) Passband ripple in the post-conditioning lowpass filter 44.
  (iii) Processing delay (typically a small fraction of T).
  (iv) Zero-order hold response modelling the effect of holding the output from convertor 42 at the constant level $h_i.x_{k-i}$ over the period $$\left(k - \frac{i}{N}\right) \cdot T \text{ to } \left(k - \frac{i-1}{N}\right) \cdot T.$$

This again is represented by an impulse response of the form $\phi_{(T/N)}(\tau)$:

$$\phi_{\frac{T}{N}}(\tau) = \begin{cases} 1, 0 \leq \tau < \frac{T}{N} \\ 0, \text{otherwise} \end{cases}$$

FIG. 6 shows an implementation of the filter described in FIG. 4 as applied for use with an echo canceller for use on a four wire communication link. In FIG. 6, an input line 50 on a four wire link to the "receive" side of a "Hybrid" (not shown) is shown. The hybrid has a connection (not shown) to a two wire communication link and is also connected to an output line 62 at a "send" side thereof.

The line 50 includes a lowpass filter 28, and output from this, which is also applied to the receive terminal of the hybrid, is passed to the sample and hold circuit 30, thence to the analogue-to-digital converter 32, and to the digital X store 34. Output from the store 34 is in this instance converted to analogue form by the converter 52. The H store 36 is connected for application of its output, together with the output from the converter 52, to the multiplying digital/analogue multiplier 54 as previously described. The send terminal of the hybrid is connected to an output line 56 and the output of the multiplying converter 54 as well as from the line 56 are applied to a difference amplifier 58. Output from this is passed to a lowpass filter 46, thence to the output line 62 from the hybrid. Line 62 is connected to a cross correlating circuit 64 which also receives output from the convertor 52 and provides cross correlation computations at the output 66 thereof. The signal at output 66 is converted to digital form by a simple analogue-to-digital converter 68 and the output from this, and the output from the store 36, are connected to a digital adder 70 arranged so that, by circulating store 36, computed alterations to the H values stored in store 36 are applied via the adder to update the stored values therein. Suitable sampled analogue stores of the charged coupled or bucket brigade type may be used to replace the block comprising elements 30, 32, 34 and 52 in FIG. 6.

In use, the circuit shown operates, then, to modify the H values stored in store 36 in accordance with the cross correlation between the signals on lines 50 and 62 in a manner tending to minimize this cross correlation between these signals. The cross correlators 64 may comprise analogue multipliers operating to multiply samples of the signal on line 62 by corresponding samples appearing at the output of converter 52. Circulation of the stores 34, 36 is carried out in the same manner as described above. That is to say, each time a new sample is passed into store 34, this store, together with the store 36 are circulated so that the outputs therefrom are applied to the converter 54. The cross correlator 64 receives the circulated outputs in analogue form in the same way.

The described arrangement has been advanced merely by way of explanation and many modifications may be made thereto without departing from the spirit and scope of the invention which includes every novel feature and combination of novel feature herein disclosed.

I claim:

1. A transversal filter for generating, from an input signal x(t), a filtered output signal y(t); the filter comprising
    (a) Sampling means for sampling the input signal at consecutive equi time-spaced intervals T to produce the sequence of consecutive samples $x_n$ (n = ...,0,1,2,3, ... );
    (b) first storing means for storing consecutive sets of said samples, each such set, $S_i$(i = $-\infty$, ... 0, ... $\infty$) comprising the N samples $x_{i-k}$(k=0,1, ... ,N−1);
    (c) second storing means for storing N coefficients $h_k$(k=0,1 ..., N−1) together representing a linear filter impulse response;
    (d) generating means for generating from each said set of stored samples, and from the impulse response coefficients stored in said second storing means, the products $h_k \cdot x_{i-k'}$ and for presenting these as product signals at an output from the generating means; and
    (e) a lowpass filter connected to receive the said product signals and to generate the said output signal by lowpass filtering the product signals whereby the said input and output signals are related substantially by the following convolution relationship:

$$Y(t) = \phi_{\frac{T}{N}}(t) * \sum_{i=0}^{N-1} h_i x(t - i \cdot T')$$

where $\phi_{\frac{T}{N}}(t) = 1, 0 < t < \frac{T}{N}$

= 0, otherwise;

and T' is a time interval not equal to T.

2. A transversal filter as claimed in claim 1 wherein said generating means presents said product signals at its output consecutively as analogue signals of equal duration at equi-spaced internals T/N.

3. A transversal filter as claimed in claim 2 wherein said consecutive analogue signals from the generating means are of duration T/N.

4. A transversal filter as claimed in claim 3 wherein T' is either slightly greater or slightly less than T.

5. A transversal filter as claimed in claim 4 wherein T' is slightly less than T.

6. A transversal filter as claimed in any preceding claim wherein said first storing means comprises a first digital shift register, an analogue-to-digital convertor being connected between the said sampling means and said shift register.

7. A transversal filter as claimed in claim 6 wherein said second storing means comprises a second digital shift register with the impulse response coefficients being, in use, stored in sequence therein in digital form.

8. A transversal filter as claimed in claim 7 wherein said generating means comprises a digital multiplier together with means for circulating the said shift registers so as to apply corresponding outputs $x_k$, $h_k$ from the registers thereto for multiplication after each new said sample has been admitted to the first shift register.

9. A transversal filter having an overall impulse response of the form:

$$h(\tau) = f(\tau) * \sum_{i=0}^{N-1} h \cdot \delta(\tau - \tau_i),$$

and producing, from an applied input signal x(t) an output signal y(t), said transversal filter comprising:
    delay means including storage means for storing coefficients $h_i$, and a low pass filter, said delay means being coupled to receive said input signal x(t) for generating therefrom a signal z(t) in the form:

$$z(t) = x_{k-i} h_i, (k - i)T + \tau_i \leq t < (k - i + 1)T + \tau_{i-1}$$

-continued $$x_k = x(kT);$$

said low pass filter being coupled to said delay means to receive said signal z(t) for generating therefrom said output signal y(t) in the form $$y(t) = \int_0^\infty h(\tau) \cdot x(t - \tau) d\tau,$$

where T represents a time interval, $f(\tau)$ is an impulse response accounting for fixed linear filtering at the input and output, independent of the settings $h_i$, and $\delta(\tau-\tau_i)$ is the Dirac delta function defined as a function of time interval $\tau$ and of a set of time delays $\tau_i$, where $\tau_i$ is not equal to iT.

10. An echo canceller comprising, in combination, a transversal filter, combining means and coefficient updating means, said filter comprising
  (a) Sampling means for sampling the input signal at consecutive equi time-spaced intervals T to produce the sequence of consecutive samples $x_n$ (n = ...,0,1,2,3...);
  (b) first storing means for storing consecutive sets of said samples, each such set, $S_i$ (i = $-\infty$, ...0, ...$\infty$) comprising the N samples $x_{i-k}$ (k=0,1,...,N−1);
  (c) second storing means for storing N coefficients $h_k$ (k=0,1,...,N−1) together representing a linear filter impulse response;
  (d) generating means for generating from each said set of stored samples, and from the impulse response coefficients stored in said second storing means, the products $h_k \cdot x_{i-k}$ and for presenting these as product signals at an output from a generating means; and
  (e) a lowpass filter connected to receive the said product signals and to generate the said output signal by lowpass filtering the product signals whereby the said input and output signals are related substantially by the following convolution relationship:

$$Y(t) = \phi_{\frac{T}{N}}(t) * \sum_{i=0}^{N-1} h_i x(t - i \cdot T')$$

where $\phi_{\frac{T}{N}}(t) = 1, 0 < t < \frac{T}{N}$ $\quad = 0$, otherwise;

and T' is a time interval not equal to T, said combining means being connected in use to receive said output signal and a further signal and to combine these to produce a combined signal;

said updating means being connected to receive said combined signal and to in use modify said coefficients $h_k$ so that said output signal tends to suppress in said combined signal components which correspond to said input signal.

11. An echo canceller as claimed in claim 10 wherein said updating means comprises means for generating a signal representative of the cross correlation between the said combined and input signals and means for modifying said coefficients in accordance with computed values of cross correlation.

* * * * *